United States Patent
Stokkermans

(10) Patent No.: US 10,008,397 B2
(45) Date of Patent: Jun. 26, 2018

(54) PNEUMATIC WAFER EXPANSION

(71) Applicant: Nexperia B.V., Nijmegen (NL)

(72) Inventor: Jozef Petrus Wilhelmus Stokkermans, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 624 days.

(21) Appl. No.: 14/478,866

(22) Filed: Sep. 5, 2014

(65) Prior Publication Data

US 2016/0071748 A1     Mar. 10, 2016

(51) Int. Cl.
  *H01L 21/78*    (2006.01)
  *H01L 21/67*    (2006.01)
  *H01L 21/02*    (2006.01)

(52) U.S. Cl.
  CPC .. *H01L 21/67092* (2013.01); *H01L 21/02035* (2013.01); *H01L 21/67132* (2013.01)

(58) Field of Classification Search
  CPC ... H01L 21/78; H01L 21/02035; H01L 21/67; H01L 21/67092; H01L 21/67132; B26F 3/00
  USPC ............ 225/73, 106, 96, 96.5; 264/314
  See application file for complete search history.

(56) References Cited

U.S. PATENT DOCUMENTS 3,730,410 A  *  5/1973  Altshuler ............ B28D 5/0047
                                        225/2
5,310,104 A      5/1994  Zaidel et al.
2006/0005911 A1  1/2006  Kubo et al.
2006/0012020 A1  1/2006  Gilleo
2008/0196229 A1  8/2008  Van Beuningen

OTHER PUBLICATIONS

"Wafer Expander"; Technovision, Inc., retrieved from Internet, http://www.techvision.co.jp/english/products/expander.htm; Oct. 25, 2008.
"Die Matrix Expanders, Model UH132 Series: (UH132, UH132-12)—Motor Drive", retrieved from Internet, http://www.ultronsystems.com/USI-ProdDMExpand.html#DMExpanders; Jan. 28, 2013.
"Die Matrix Expander, Model UH130"; Ultron Systems, Inc.; 4 pgs.; Feb. 9, 2004.

* cited by examiner

*Primary Examiner* — Christina Johnson
*Assistant Examiner* — Xue Liu
(74) *Attorney, Agent, or Firm* — Ohlandt, Greeley, Ruggiero & Perle, L.L.P.

(57) ABSTRACT

A die expansion tool and method for expanding foil of a foil carrier connected to a frame is disclosed. In the embodiment, the die expansion tool has an inner body within a cavity formed by an outer body. The frame of the foil carrier can be positioned within the outer body and a wafer attached to the foil of the foil carrier can be positioned over the inner body. A pressurized fluid system, also within the cavity of the outer body, is positioned such that the pressurized fluid system can move the frame axially around the inner body and expand the foil.

19 Claims, 7 Drawing Sheets

PNEUMATIC WAFER EXPANSION

BACKGROUND

Modern components, such as integrated circuits (ICs) or discrete transistors, are produced on a large scale by fabricating several components on a silicon wafer. The process utilizes a thin silicon wafer with a typical diameter of 150, 200, or 300 mm. Various processes are implemented to fabricate the desired electronic circuits on the silicon wafer. The end result is a very dense cluster of thousands of components fabricated on a single wafer. Once the components are fabricated, each component, typically called a "die" must be removed from the cluster on the wafer for packaging or further processing. Because the cluster is so dense, picking a die off of the wafer can often damage the neighboring dies. To reduce the possibility of damaging the neighboring dies, the wafer can be expanded to introduce space in between the dies.

In one die expansion technique, a silicon wafer is placed on a tape or foil and the tape or foil is then mounted on a frame to hold the wafer in place. The wafer is then placed in a die expansion tool that stretches the tape or foil to introduce space in between the dies. Typically, die expansion tools use a movable anvil that pushes axially on the wafer to expand the tape or foil to introduce space in between the dies. In typical die expansion tools, the anvil is commonly moved (e.g., axially to the wafer) by large and heavy motors. Additionally, because the anvil moves, space is needed within the die expansion tool to house the anvil when it is retracted and space is needed above the die expansion tool so that the anvil can extend. Because of the size and weight of the motors and the space needed to accommodate the anvil, die expansion tools are often large and heavy.

SUMMARY

In an embodiment, a die expansion tool for expanding foil of a foil carrier connected to a frame is disclosed. In the embodiment, the die expansion tool has an inner body within a cavity formed by an outer body. The frame of the foil carrier can be positioned within the outer body and a wafer attached to the foil of the foil carrier can be positioned over the inner body. A pressurized fluid system, also within the cavity of the outer body, is positioned such that the pressurized fluid system can move the frame axially around the inner body and expand the foil.

In a second embodiment, a method for expanding a wafer on a foil carrier using a die expansion tool is disclosed. In the embodiment, the method involves positioning the foil carrier over a body of the die expansion tool, wherein the foil carrier includes foil coupled to a frame and pressurizing a fluid to move the frame axially around the body.

In a third embodiment, a die expansion tool for expanding foil of a foil carrier to which a wafer is attached is disclosed. In the embodiment, the die expansion tool has an outer body, the outer body forming a cavity in which a frame of the foil carrier can be positioned, a stationary anvil within the cavity of the outer body over which the wafer attached to the foil can be positioned, and a pneumatic tube positioned within the cavity of the outer body such that, when inflated with pressurized fluid, the pneumatic tube moves the frame axially around the stationary anvil to expand the foil.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
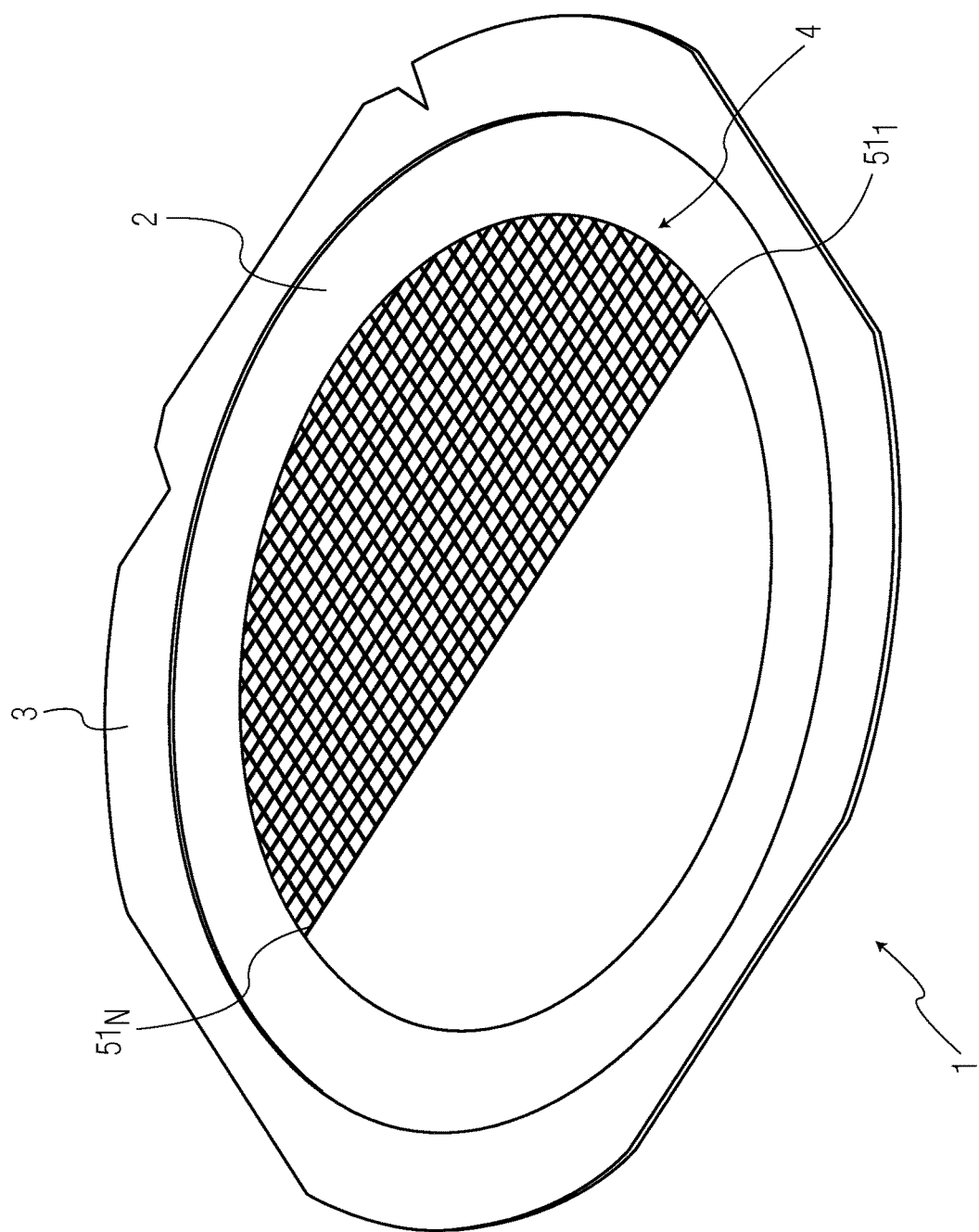
FIG. 1 is a perspective view of a foil carrier to which a silicon wafer is attached.

FIG. 1 is a perspective view of a foil carrier 1 to which a silicon wafer 4 is attached. The foil carrier includes an adhesive tape or foil 2 that is connected to a ring-shaped frame 3 along an outer edge of the foil. In an embodiment, the silicon wafer is adhered to the foil carrier and the wafer is then scored in order to help define a plurality of dies $51_1$-$51_n$. In the embodiment of FIG. 1, the scores have been exaggerated on a part of the silicon wafer to better indicate the plurality of dies. The foil carrier and the attached silicon wafer can then be placed within a die expansion tool.

Figure 2A:
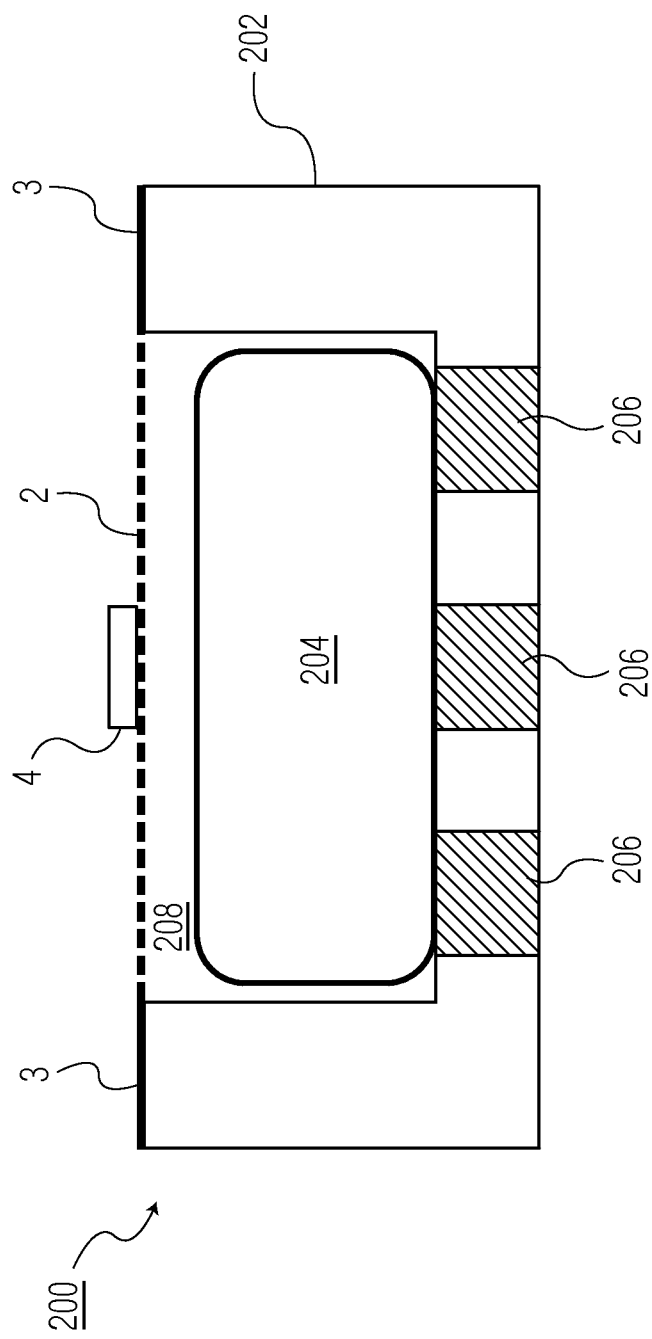
FIG. 2A is a perspective view of a known die expansion tool with an anvil in a recessed position.

FIG. 2A is a perspective view of a known die expansion tool with an anvil in a recessed position. The die expansion tool of FIG. 2A includes an outer body 202 and an inner body 204 in a recessed position within a recess 208 in the outer body. Additionally, actuators (not shown) and motors 206 to power the actuators are housed within the outer body. Initially, as illustrated in FIG. 2A, the movable anvil (i.e., the inner body) is depressed in the recess and the silicon wafer and foil carrier of FIG. 1 are positioned such that the frame of the foil carrier is supported by the outer body and the wafer 4, centered on the foil 2, is positioned over the recess.

Figure 2B:
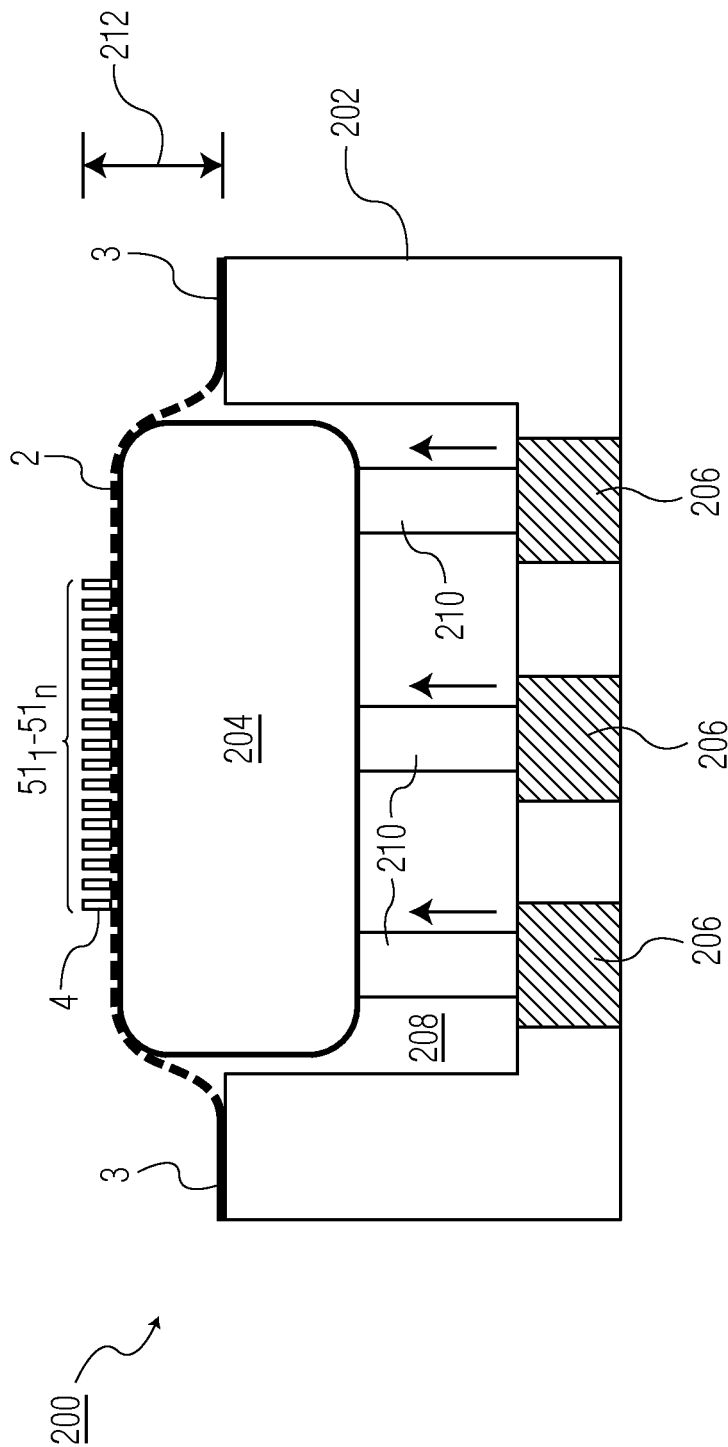
FIG. 2B is a perspective view of the known die expansion tool of FIG. 2A with the anvil in an axially extended position.

FIG. 2B is a perspective view of the known die expansion tool of FIG. 2A with the anvil in an axially extended position. Once the foil carrier is positioned, as described with reference to FIG. 2A, actuators 210 extend the movable anvil up out of the recess 208 and axially through the frame 3 of the foil carrier. In order for the actuators to extend the movable anvil, a sufficient amount of space into which the movable anvil can extend is required above the outer body as indicated by dimension 212. As the movable anvil extends and passes axially through the frame, pressure on the foil 2 increases, thus, causing the foil to be stretched. The stretching causes individual dies $51_1$-$51_n$ on the wafer 4 to be pulled radially apart and introduces space between the dies, which reduces the chance of damaging the neighboring die when picking a die off of the wafer.

Die expanders, such as the die expander described with reference to FIGS. 2A and 2B, typically have large dimensions in order to house the movable anvil when the movable anvil is recessed and to provide room for the movable anvil to extend. In addition to large dimensions, die expanders are also typically heavy due to motors that power the actuators that extend the movable anvil. The motors are often large and heavy because each motor must produce enough force to overcome the tensile strength of the foil. Thus, the size and weight of the motors in addition to the size and weight of the movable anvil results in die expansion tools that are characteristically large and heavy.

The manufacture and packaging of integrated circuit devices typically requires the use of die expansion tools. As a result, there can be a bottleneck in the manufacturing and packaging of dies caused due to a limited availability of die expansion tools. One way to increase the availability of die expansion tools is to increase the number of die expansion tools that can be integrated into the manufacturing and packaging process by decreasing the weight and space needed to integrate additional die expansion tools. Additionally, using a more lightweight and rigid construction for the die expansion tools can further alleviate the bottleneck by allowing fast and accurate performance of the die expansion tool while limiting the impact of forces resulting from the performance of the die expansion tool on the machine frame that is housing the die expansion tool.

In accordance with an embodiment of the invention, a die expansion tool can be configured to use pressurized fluid to move a frame axially around an anvil. For example, rather than extending an anvil from within an outer body using motor-driven actuators, as illustrated with reference to FIGS. 2A and 2B, a flattened pneumatic tube can be inflated with pressurized fluid to push the frame of the foil carrier down around a stationary anvil, thus, stretching the foil and expanding the wafer. Therefore, additional space above the outer body can be reduced and internal motors are not needed to raise the anvil. Accordingly, space and weight can be decreased in comparison to conventional die expansion tools such as those described with reference to FIGS. 2A and 2B.

Figure 3A:
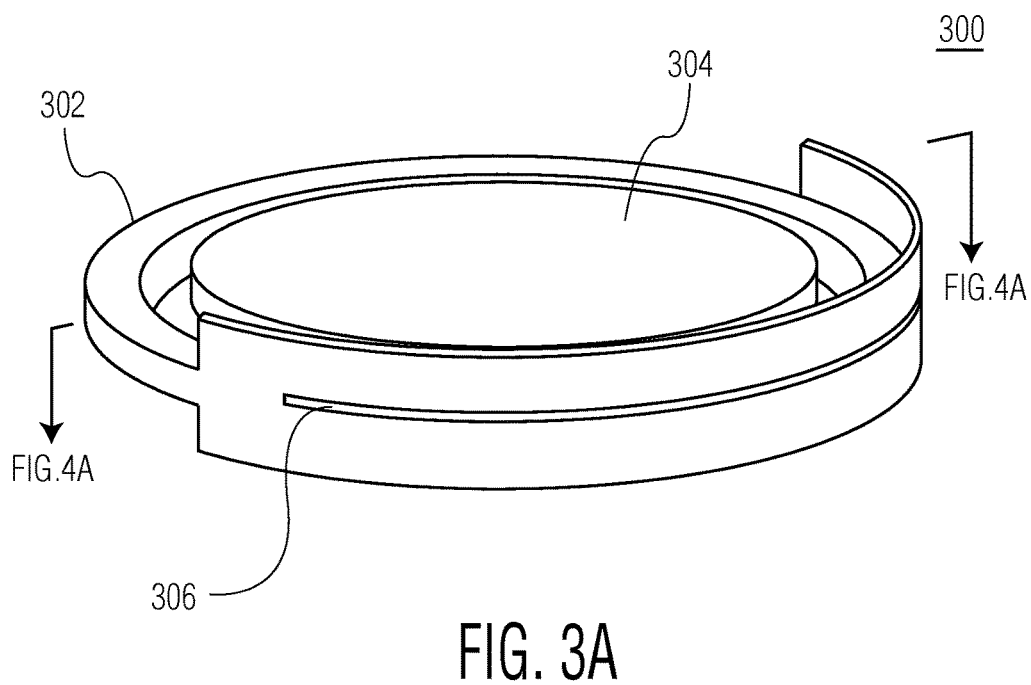
FIG. 3A is a perspective view of a die expansion tool that utilizes a pressurized fluid system to expand a silicon wafer in accordance with an embodiment of the invention.
Figure 3B:
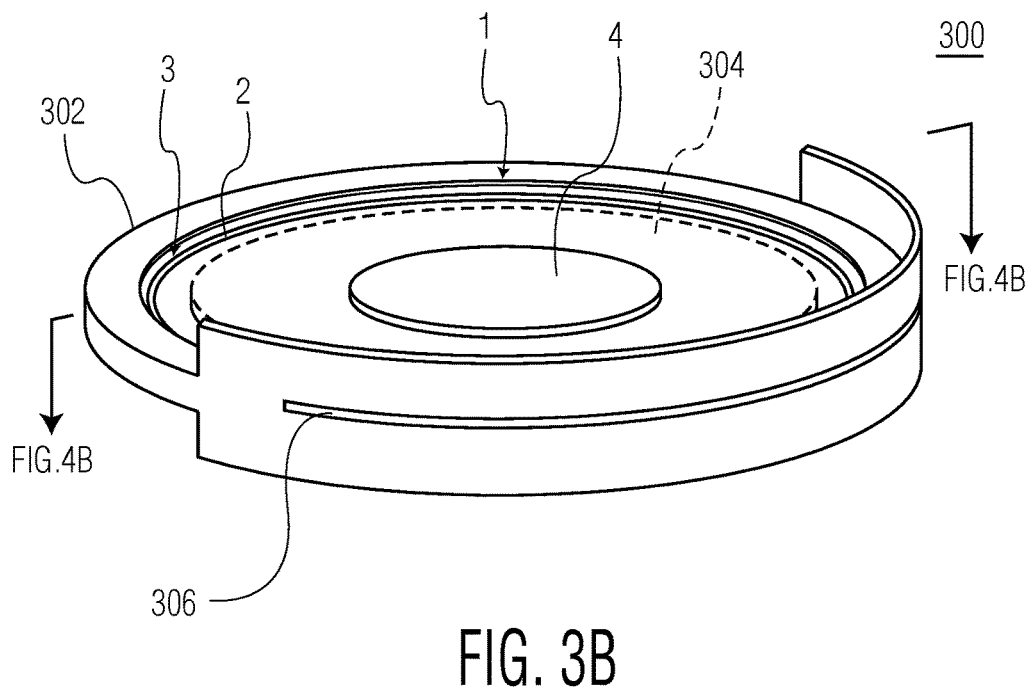
FIG. 3B is a perspective view of the die expansion tool of FIG. 3A after a foil carrier has been positioned through an opening in the outer body.

FIG. 3A is a perspective view of a die expansion tool 300 that utilizes a pressurized fluid system to expand a silicon wafer in accordance with an embodiment of the invention. The die expansion tool includes an outer body 302 and a stationary anvil 304 (i.e., an inner body) that remains stationary within the outer body while the foil is expanded. The outer body has an opening 306 through which a foil carrier can be positioned over the anvil by inserting the foil carrier through the opening. FIG. 3B is a perspective view of the die expansion tool 300 of FIG. 3A after a foil carrier 1 and silicon wafer 4, such as the foil carrier and silicon wafer of FIG. 1, have been positioned through the opening 306 in the outer body 302. As illustrated in FIG. 3B, the frame 3 of the foil carrier is supported within the outer body, while the wafer 4, suspended by the foil 2 of the foil carrier, is centered over the anvil 304 (not visible as indicated by the dotted line).

Figure 4A:
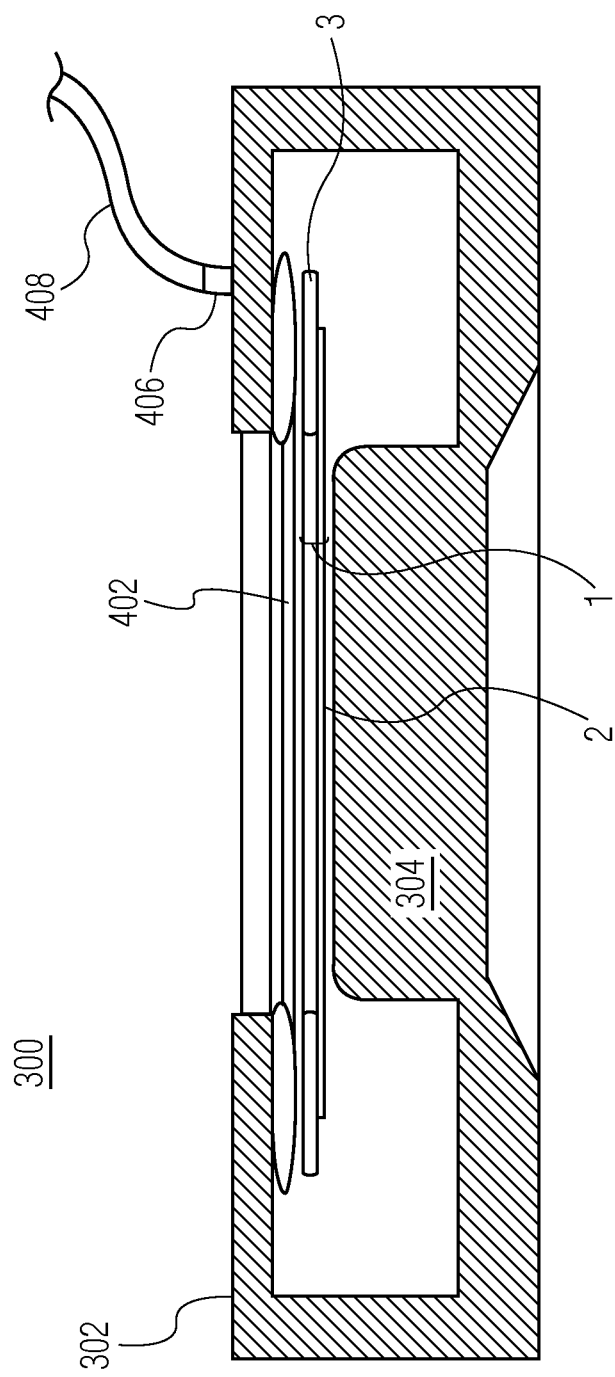
FIG. 4A is a side cutaway of the die expansion tool of FIG. 3B.

FIG. 4A is a side cutaway of the die expansion tool 300 of FIG. 3B. The die expansion tool includes an outer body 302 and a stationary anvil 304. The outer body forms a cavity and has a pressurized fluid interface 406 that can be attached to a pressure line 408. The stationary anvil is fixed within the cavity formed by, for example, a casing or a chamber (i.e., the outer body.) In an embodiment, the anvil is stationary in that the anvil does not move during operation of the die expansion tool. In the embodiment of FIG. 4A, the anvil does not move because the anvil and the outer body form a single "C" shaped body (e.g., a monolithic piece of metal formed into a "C" shape). In another embodiment, the anvil and the outer body that form the "C" shape are two separate pieces of metal, but are configured to remain in a singled fixed position in relation to each other while the foil is expanded. A gap in the "C" shape, located between a top wall of the cavity and a top surface of the anvil, is aligned with the opening in the outer body in order to accommodate a foil carrier. A deflated pneumatic tube 402 runs continuously through the cavity and is located along the top wall of the cavity. In an embodiment, the pneumatic tube is a circular tube that forms a single chamber, similar to the structure of an inner tube, and that is positioned around an interior wall of the cavity. A foil carrier 1, such as the foil carrier of FIG. 1, is located under the deflated pneumatic tube such that the frame 3 of the foil carrier is vertically aligned with the pneumatic tube and horizontally aligned with the "C" shaped gap. When the pneumatic tube is inflated, the pneumatic tube places upward pressure on the top wall of the cavity and downward pressure on the frame of the foil carrier causing the frame to descend axially around the anvil and stretch the foil 2 as described below. In other embodiments, the continuous pneumatic tube can be replaced with other pneumatic systems (e.g., multiple individual pneumatic tubes evenly spaced around the inside surface of the outer body) or configurations such that downward pressure is applied evenly on the frame of the foil carrier by the pressurized fluid system, thereby causing even radial expansion of the foil.

Figure 4B:
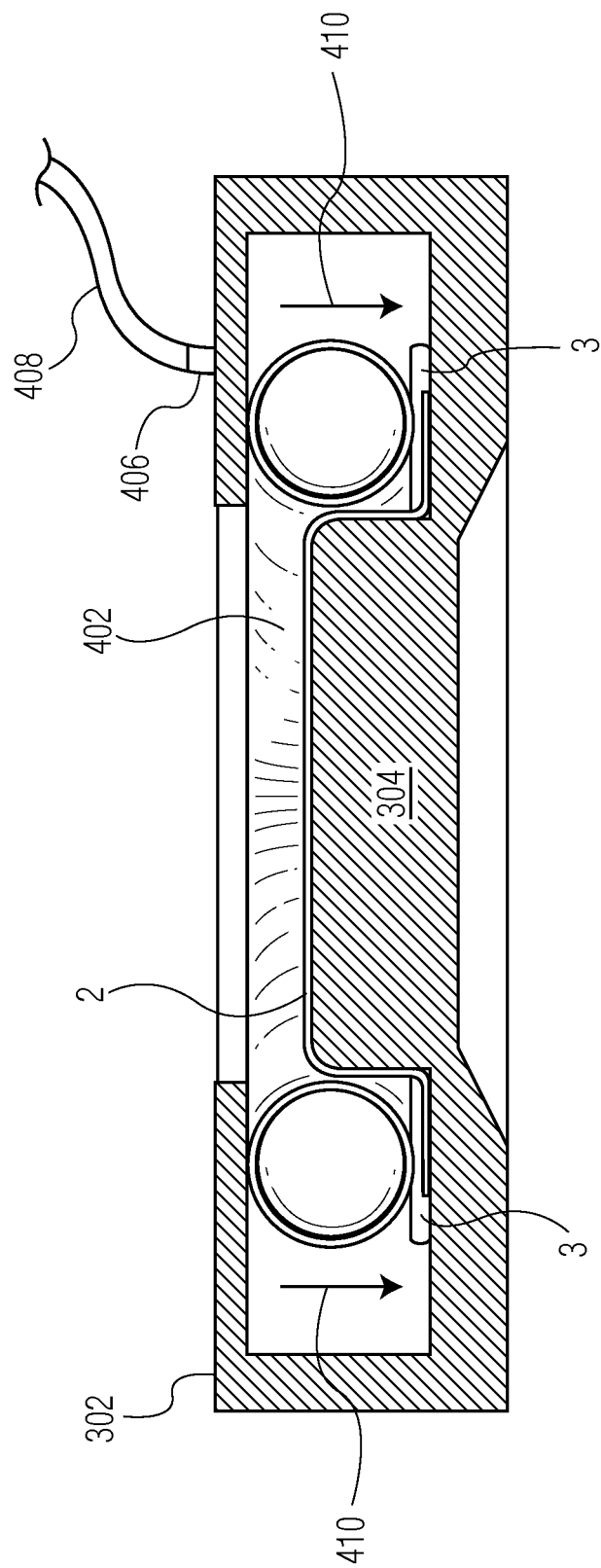
FIG. 4B is a side cutaway of the die expansion tool of FIG. 4A after the pressurized fluid system has been pressurized in accordance with an embodiment of the invention.

FIG. 4B is a side cutaway of the die expansion tool 300 of FIG. 4A after the pressurized fluid system has been pressurized. As illustrated in FIG. 4B, the pneumatic tube 402 has been inflated by a pressurized fluid, such as compressed air, that was delivered via the pressure line 408 attached to the pressurized fluid interface 406 and forced into the pneumatic tube. As the pneumatic tube is inflated, the tube pushes the frame down axially around the anvil 304 (as indicated by downward arrows 410), thus, stretching the foil down along the sides of the anvil and expanding the wafer (not shown). As a result, space is introduced between the dies. In an embodiment, the compressed air is provided by compressors located external to the die expansion tool via pressure lines connected to a pressurized fluid interface 406 in the outer body.

Figure 5:
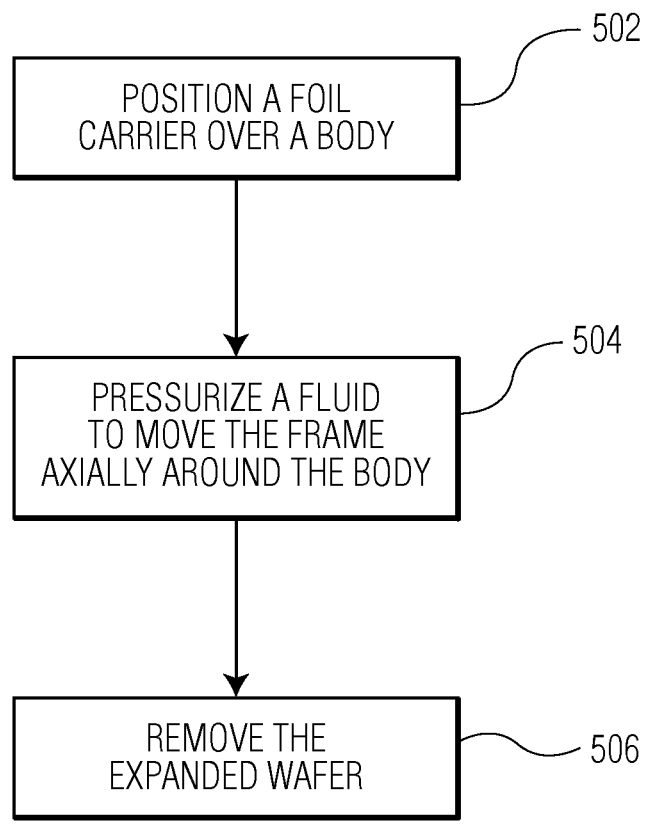
FIG. 5 is a flow diagram of a method for expanding a wafer in accordance with an embodiment of the invention.

FIG. 5 is a flow diagram of a method for expanding a wafer in accordance with an embodiment of the invention. At block 502, a foil carrier is positioned over a body (i.e., a stationary anvil) of a die expansion tool. In an embodiment, the foil carrier is positioned within an outer body of a die expansion tool such that a wafer adhered to the foil of the foil carrier is positioned above a stationary anvil. At block 504, a fluid is pressurized in order to move the frame axially around the body. In an embodiment, the pressurized fluid is used to inflate a pneumatic tube housed within the outer body of the die expansion tool, which presses down axially on the frame of the foil carrier when inflating and, as a result, the foil is stretched axially down and around the inner body. The stretching causes individual dies on the wafer to be pulled radially apart and introduces space between the dies. At block 506, the expanded wafer is removed from the die expansion tool. In an embodiment, the pneumatic tube is deflated before the expanded wafer is removed. In an embodiment, once the wafer has been expanded, the wafer is reframed (i.e., the foil to which the wafer is adhered is attached to a second ring-shaped frame similar to the frame of the foil carrier) and then cut from the foil carrier before the pneumatic tube is deflated in order to prevent the expanded foil from shrinking back to the original size.

Expanding wafers is an integral part of integrated circuit device manufacturing and packaging, and reducing the size and weight of die expansion tools used to expand the wafers can improve the process. By using a stationary anvil and a pressurized fluid system instead of a movable anvil, actuators, and motors, the weight and size of die expansion tools can be reduced. The reduction in weight and size can, for example, allow for more die expansion tools to be integrated into the manufacturing and packaging process. Additionally, modifications to the manufacturing and packaging process will likely not be needed to utilize the pressurized fluid system, because compressed fluids (e.g., compressed air) are typically already utilized by other components of the manufacturing and packing process and can easily be made available to the pressurized fluid system without additional facilities. Thus, by using a pressurized fluid system in die expansion tools, the manufacturing and packaging process of dies can be improved.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A die expansion tool for expanding foil of a foil carrier to which a wafer is attached, the die expansion tool comprising:
   an outer body, the outer body forming a cavity in which a frame of the foil carrier can be positioned;
   an inner body within the cavity of the outer body over which the wafer attached to the foil can be positioned; and
   a pressurized fluid system positioned within the cavity of the outer body and configured to move the frame axially around the inner body to expand the foil, wherein the pressurized fluid system comprises at least one pneumatic tube that, when pressurized, moves the frame axially around the inner body.

2. The die expansion tool of claim 1, wherein the pressurized fluid system is configured to apply distributed radial pressure to the frame.

3. The die expansion tool of claim 1, wherein the at least one pneumatic tube is a circular tube forming a single chamber.

4. The die expansion tool of claim 1, wherein the outer body and the inner body form a single body.

5. The die expansion tool of claim 1, wherein the inner body is configured with respect to the outer body such that the inner body remains stationary within the cavity of the outer body while the foil is expanded.

6. The die expansion tool of claim 1, wherein the outer body further comprises a pressurized fluid interface through which pressurized fluid is provided to the pressurized system.

7. The die expansion tool of claim 6, wherein pressurized fluid is pressurized external to the die expansion tool and provided via the pressurized fluid interface.

8. A method for expanding a wafer on a foil carrier using a die expansion tool, the method comprising:
positioning the frame of the foil carrier in an outer body of the die expansion tool, the outer body forming a cavity in which the frame of the foil carrier is positioned:
positioning the foil carrier over an inner body of the die expansion tool, wherein the foil carrier includes foil coupled to a frame, wherein the inner body is within the cavity of the outer body, and wherein the foil carrier is positioned over the body such that the wafer on the foil is positioned over the inner body; and
pressurizing a fluid to move the frame axially around the body, wherein the pressurizing of the fluid to move the frame axially around the body comprises filling at least one pneumatic tube with pressurized fluid so that the tube expands and moves the frame axially around the body of the die expansion tool.

9. The method of claim 8, wherein the fluid is pressurized to move the frame from a raised position to a lowered position axially around the inner body.

10. The method of claim 8, wherein the fluid is pressurized external to the die expansion tool by an external compressor.

11. The method of claim 8, wherein after the fluid is pressurized and the frame has moved axially around the inner body, but before the fluid is depressurized, reframing and cutting the wafer from the foil carrier.

12. The method of claim 8, wherein the foil carrier is positioned over the body such that the wafer on the foil is centered over the inner body.

13. A die expansion tool for expanding foil of a foil carrier to which a wafer is attached, the die expansion tool comprising:
an outer body, the outer body forming a cavity in which a frame of the foil carrier can be positioned;
a stationary anvil within the cavity of the outer body over which the wafer attached to the foil can be positioned; and
at least one pneumatic tube positioned within the cavity of the outer body such that, when inflated with pressurized fluid, the pneumatic tube moves the frame axially around the stationary anvil to expand the foil.

14. The die expansion tool of claim 13, wherein the stationary anvil is configured with respect to the outer body such that the stationary anvil remains stationary within the cavity of the outer body while the foil is expanded.

15. The die expansion tool of claim 13, wherein the at least one pneumatic tube is configured to apply distributed radial pressure to the frame.

16. The die expansion tool of claim 13, wherein the at least one pneumatic tube is a circular tube forming a single chamber.

17. The die expansion tool of claim 13, wherein the outer body further comprises a pressurized fluid interface through which pressurized fluid is provided to the at least one pneumatic tube.

18. The die expansion tool of claim 17, wherein pressurized fluid is pressurized external to the die expansion tool and provided via the pressurized fluid interface.

19. A die expansion tool for expanding foil of a foil carrier to which a wafer is attached, the die expansion tool comprising:
an outer body, the outer body forming a cavity in which a frame of the foil carrier can be positioned;
an inner body in the cavity of the outer body over which the wafer attached to the foil can be positioned; and
a pressurized fluid system positioned in the cavity of the outer body and configured to apply direct pressure to only the frame to move the frame axially around the inner body to expand the foil.

* * * * *